(12) United States Patent
Heaton et al.

(10) Patent No.: US 6,255,818 B1
(45) Date of Patent: Jul. 3, 2001

(54) METHOD AND APPARATUS FOR PERFORMING MAGNETIC RESONANCE MEASUREMENTS

(75) Inventors: Nicholas J. Heaton, Houston; Dylan H. Davies, Sugar Land; M. Reza Taherian, Stafford; Boqin Q. Sun, Sugar Land; Abdurrahman Sezginer, Houston, all of TX (US)

(73) Assignee: Schlumberger Technology Corporation, Houston, TX (US)

( * ) Notice: Subject to any disclaimer, the term of this patent is extended or adjusted under 35 U.S.C. 154(b) by 0 days.

(21) Appl. No.: 09/368,341

(22) Filed: Aug. 4, 1999

Related U.S. Application Data
(60) Provisional application No. 60/097,024, filed on Aug. 18, 1998.

(51) Int. Cl.$^7$ ........................................................ G01V 3/00
(52) U.S. Cl. ............................................. 324/303; 324/318
(58) Field of Search ................................... 324/303, 306, 324/307, 309, 318, 322; 600/420

(56) References Cited

U.S. PATENT DOCUMENTS

| | | |
|---|---|---|
| 4,117,600 | 10/1978 | Guignard et al. . |
| 4,413,512 | 11/1983 | Zemanek, Jr. . |
| 4,545,242 | 10/1985 | Chan . |
| 4,574,240 | 3/1986 | Libove et al. . |
| 4,710,713 | 12/1987 | Strikman . |
| 4,717,876 | 1/1988 | Masi et al. . |
| 4,717,877 | 1/1988 | Taicher et al. . |
| 4,717,878 | 1/1988 | Taicher et al. . |
| 4,825,162 | 4/1989 | Roemer et al. . |
| 4,901,018 | 2/1990 | Lew . |
| 4,933,638 | 6/1990 | Kenyon et al. . |
| 5,023,551 | 6/1991 | Kleinberg et al. . |
| 5,055,787 | 10/1991 | Kleinberg et al. . |
| 5,055,788 | 10/1991 | Kleinberg et al. . |
| 5,153,514 | 10/1992 | Griffin et al. . |
| 5,291,137 | 3/1994 | Freedman . |
| 5,363,041 | 11/1994 | Sezginer . |
| 5,363,042 | 11/1994 | Dumoulin . |
| 5,374,890 | 12/1994 | Zou et al. . |
| 5,389,877 | 2/1995 | Sezginer et al. . |
| 5,432,446 | 7/1995 | MacInnis et al. . |
| 5,445,151 | 8/1995 | Darrow et al. . |
| 5,474,239 | 12/1995 | Williams, Jr. et al. . |
| 5,486,762 | 1/1996 | Freedman et al. . |
| 5,497,087 | 3/1996 | Vinegar et al. . |
| 5,522,260 | 6/1996 | Chappellat et al. . |
| 5,588,431 | 12/1996 | Mani et al. . |
| 5,680,043 | 10/1997 | Hurlimann et al. . |
| 5,684,399 * | 11/1997 | Bayer .................................. 324/306 |
| 5,710,511 | 1/1998 | Taicher et al. . |
| 5,712,566 | 1/1998 | Taicher et al. . |
| 5,757,186 | 5/1998 | Taicher et al. . |
| 5,796,252 | 8/1998 | Kleinberg et al. . |
| 5,928,148 * | 7/1999 | Wang et al. ......................... 600/420 |
| 6,018,243 * | 1/2000 | Taicher et al. ...................... 324/303 |

FOREIGN PATENT DOCUMENTS

| | | |
|---|---|---|
| 0 691 526 A1 | 1/1996 | (EP) . |
| 2 291 198 | 1/1996 | (GB) . |
| WO 92/00533 | 1/1992 | (WO) . |

\* cited by examiner

Primary Examiner—Louis Arana
(74) Attorney, Agent, or Firm—John J. Ryberg; Brigitte L. Jeffery

(57) ABSTRACT

A magnetic resonance measurement apparatus that is subject to relative motion between the apparatus and a specimen along a path includes a magnet, antennae and a circuit. The magnet polarizes the specimen, and the antennae are spatially distributed along the path. The circuit uses the antennae to perform magnetic resonance measurements and use the spatial distribution of the antennae to establish different polarization times for the magnetic resonance measurements.

40 Claims, 10 Drawing Sheets

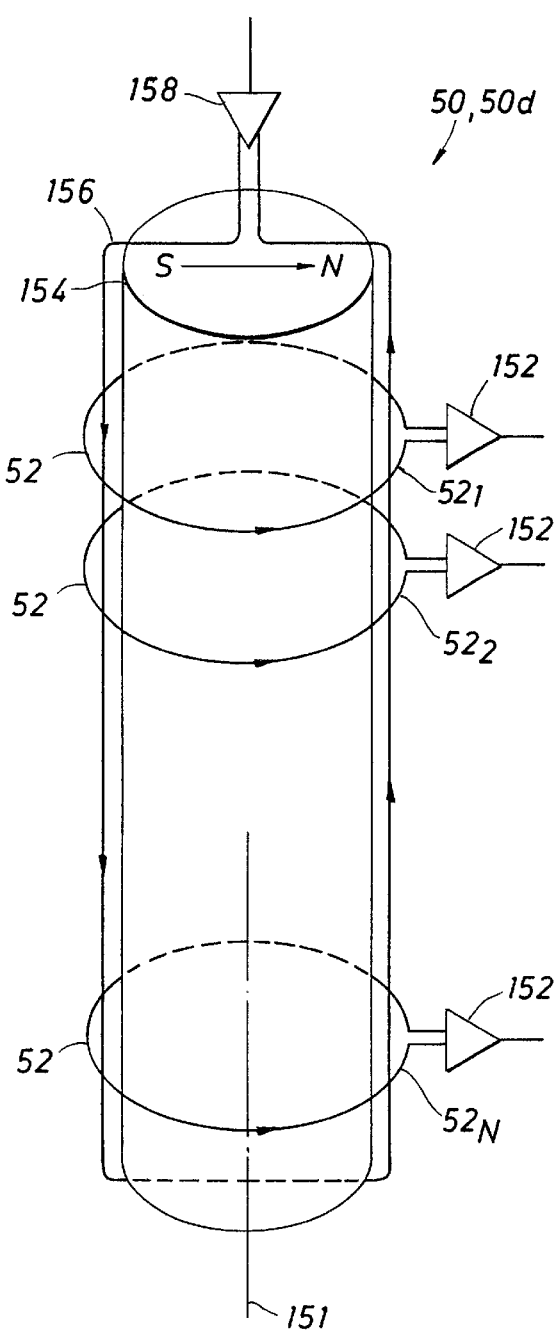
FIG.9
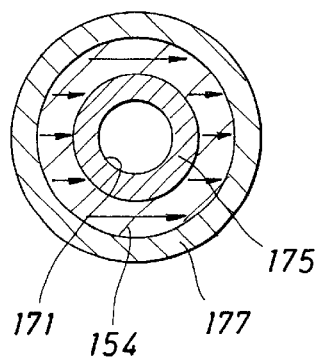
FIG.10
FIG.11

METHOD AND APPARATUS FOR PERFORMING MAGNETIC RESONANCE MEASUREMENTS

This application claims priority under 35 U.S.C. § 119 to U.S. Provisional Patent Application Ser. No. 60/097,024, filed on Aug. 18, 1998.

BACKGROUND

This invention relates to a method and apparatus for performing nuclear magnetic resonance (NMR) measurements, and more particularly, the invention relates to an arrangement for efficiently performing T1-based and T2-based measurements.

Nuclear magnetic resonance (NMR) measurements typically are performed to investigate properties of a sample. For example, an NMR wireline or logging while drilling (LWD) downhole tool may be used to measure properties of subterranean formations. In this manner, a typical NMR tool may, for example, provide a lithology-independent measurement of the porosity of a particular formation by determining the total amount of hydrogen present in fluids of the formation. Equally important, the NMR tool may also provide measurements that indicate the dynamic properties and environment of the fluids, as these factors may be related to petrophysically important parameters. For example, the NMR measurements may provide permeability and viscosity information that is difficult or impossible to derive from other conventional logging arrangements. Thus, it is the capacity of the NMR tool to perform these measurements that makes it particularly attractive versus other types of downhole tools.

Typical NMR logging tools include a magnet that is used to polarize hydrogen nuclei (protons) in the formation and a transmitter coil, or antenna, that emits radio frequency (RF) pulses. A receiver antenna may measure the response (indicated by received spin echo signals) of the polarized hydrogen to the transmitted pulses. Quite often, the transmitter and receiver antennae are combined into a single transmitter/receiver antenna.

There are several experimental parameters that may be adjusted according to the objectives of the NMR measurement and expected properties of the formation fluids. However, the NMR techniques employed in current NMR tools typically involve some variant of a basic two step sequence that includes a polarization time followed by an acquisition sequence.

During the polarization time (often referred to as a "wait time") the protons in the formation polarize in the direction of a static magnetic field (called $B_0$) that is established by a permanent magnet (of the NMR tool). The growth of nuclear magnetization M(t) (i.e., the growth of the polarization) is characterized by the "longitudinal relaxation time" (called T1) of the fluid and its equilibrium value (called $M_0$). When the specimen is subject to a constant field for a duration $t_p$, the longitudinal magnetization is:

$$M(t_p) = M_0 \left(1 - e^{\frac{-t_p}{T_1}}\right) \qquad \text{Equation 1}$$

The duration of the polarization time may be specified by the operator (conducting the measurement) and includes the time between the end of one acquisition sequence and the beginning of the next. For a moving tool, the effective polarization time also depends on tool dimensions and logging speed.

Referring to FIG. 1, as an example, a sample (in the formation under investigation) may initially have a longitudinal magnetization $M_Z$ 10 of approximately zero. The zero magnetization may be attributable to a preceding acquisition sequence (for example), as described below. However, in accordance with equation 1, the magnetization $M_Z$ 10 (under the influence of the $B_0$ field) increases to a magnetization level (called $M(t_p(1))$) after a polarization time $t_p(1)$ after zero magnetization. As shown, after a longer polarization time $t_p(2)$ from zero magnetization, the magnetization $M_Z$ 10 increases to an $M(t_p(2))$ level.

An acquisition sequence begins after the polarization time. For example, an acquisition sequence may begin at time $t_p(1)$, a time at which the magnetization $M_Z$ 10 is at the $M(t_p(1))$ level. At this time, RF pulses are transmitted from a transmitter antenna of the tool. The pulses, in turn, produce spin echo signals 16. A receiver antenna (that may be formed from the same coil as the transmitter antenna) receives the spin echo signals 16 and stores digital signals that indicate the spin echo signals 16. The initial amplitudes of the spin echo signals 16 indicate a point on the magnetization $M_Z$ 10 curve, such as the $M(t_p(1))$ level, for example. Therefore, by conducting several measurements that have different polarization times, points on the magnetization $M_Z$ 10 curve may be derived, and thus, the T1 time for the particular formation may be determined.

As an example, for the acquisition sequence, a typical logging tool may emit a pulse sequence based on the CPMG (Carr-Purcell-Meiboom-Gill) pulse train. The application of the CPMG pulse train includes first emitting a pulse that rotates the magnetization, initially polarized along the $B_0$ field, by 90° into a plane perpendicular to the $B_0$ field. A train of equally spaced pulses follows, whose function is to maintain the magnetization polarized in the transverse plane. In between the pulses, magnetization refocuses to form the spin echo signals 16 that may be measured using the same antenna. Because of thermal motion, individual hydrogen nuclei experience slightly different magnetic environments during the pulse sequence, a condition that results in an irreversible loss of magnetization and consequent decrease in successive echo amplitudes. This rate of loss of magnetization is characterized by a "transverse relaxation time" (called T2) and is depicted by the decaying envelope 12 of FIG. 1. This may be referred to as a T2-based experiment.

Measurements of T1 are typically made using a method known as saturation recovery. In this approach, longitudinal magnetization is first destroyed, then allowed to recover for a length of time, $t_p$, at which point it is monitored, using a radio frequency pulse or sequence of pulses, and the signal recorded in a receiver. The signal amplitude is proportional to the recovered magnetization at time, $t_p$. By repeating the measurement for different $t_p$ values, the magnetization recovery profile, $Mz(t_p)$, is sampled and may be analyzed to determine the longitudinal relaxation time T1. This may be referred to as a T1 based experiment. If a sequence of pulses such as the CPMG sequence is used to monitor the magnetization recovery at time, $t_p$, the initial amplitude of the echo decay envelope represents $Mz(t_p)$, while the echo decay profile, 12, yields T2 information corresponding to this longitudinal magnetization, $Mz(t_p)$. Analysis of these experiments provides information concerning both T1 and T2.

In a CPMG pulse train with a spacing (called TE) between the pulses, applied to a sample containing a single type of fluid, an amplitude, A(n) of the nth echo may be described by the following equation:

$$A(n) = M(t_p)e^{\frac{nT_E}{T2}} = M_0\left(1 - e^{\frac{-t_p}{T1}}\right)e^{\frac{-nT_E}{T2}}, \quad \text{Equation 2}$$

where $t_p$ is the polarization time.

The measured NMR signal, $A(n)$, is governed by three quantities ($M_0$, T1 and T2) that reflect physical properties of the fluids and the formation. The equilibrium longitudinal magnetization $M_0$ is used to compute the total porosity of formation, as described by the following equation:

$$\phi = \frac{KM_0}{HI}, \quad \text{Equation 3}$$

where HI is the hydrogen index of the formation fluid, and K is a calibration factor that accounts for several tool and external parameters. Relaxation times are related to permeability of the formation as well as the fluid properties and may be used to identify hydrocarbon types. Water relaxation times increase with increasing pore size. Thus, short T1 or T2 times indicate bound water, while long T1 and T2 times are associated with free fluid. For hydrocarbons in water wet rocks, the T1 and T2 times are determined by viscosity. The T1 time increases with decreasing viscosity over the entire hydrocarbon range from bitumen to methane gas. The T2 time follows a similar trend for heavy and medium oils. For lighter hydrocarbons, diffusion effects reduce the T2 time. The effect is most significant for gas. Because of the wide range of pore sizes found in rock formations and the chemical complexity of typical oils, broad distributions of T1 and T2 times are usually observed. Whereas T2 distributions may be estimated by analysis of multi-exponential decays of CPMG echo amplitudes, it is necessary to perform several separate measurements using different polarization times $t_p$, in order to properly characterize T1 distributions.

Typical logging tools that are based on the single antenna concept measure CPMG echo decay profiles using a fixed polarization time. In order to determine total porosity, a polarization time of at least three times the largest T1 time in the formation fluids may be used. In general, the T1 time is not known prior to logging, and thus, it is necessary to guess a reasonable value and set duration of the polarization time accordingly to this estimate. Overestimation of the T1 time results in inefficient logging, since the logging speed must be reduced accordingly. Underestimation of the T1 time leads to incomplete polarization and consequently, an underestimation of the total porosity.

In some cases it is considered expedient to obtain an experimental estimate of the T1 time. This may be done either to obtain an improved porosity estimate or for the purposes of hydrocarbon typing. The procedure for determining the T1 time with current tools includes repeating the standard NMR measurement (such as the CPMG pulse train) using different polarization times. As an example, after waiting for a first polarization time $t_p(1)$ see FIG. 1), a first CPMG pulse train may be applied to obtain the spin echo signals 16. In this manner, the initial amplitudes of the pulse train may be used to measure the magnetization level $M(t_p(1))$, as an example. The CPMG pulse train effectively destroys the magnetization $M_Z$ (i.e., decreases the magnetization $M_Z$ 10 to approximately zero near the antenna). The next CPMG pulse train that is applied to obtain spin echo signals 18 to measure the $M(t_p(2))$, level (for example) must first wait for a polarization time $t_p(2)$. This ensures that the polarization that was destroyed by the previous CPMG sequence is polarized by a predetermined duration in the intersection of the regions sensed by two consecutive CPMG sequences.

Therefore, measuring two points on the magnetization $M_Z$ curve 10 takes a time approximately equal to the summation of the times $t_p(1)$ and $t_p(2)$, a time that may consume several seconds, for example. Thus, using different polarization times may inevitably lead to a significant increase in the total logging time. Because of the typically limited number (due to the desire to decrease logging time) of different polarization times that may be used, it is rarely feasible to derive precise T1 times. Thus, analysis of the measurements is generally limited to simple comparisons of the separate measurements.

In the medical field, NMR measurements are performed with an "outside-in" device to investigate properties of a sample. U.S. Pat. No. 5,363,042 issued to Charles L. Dumoulin describes a magnetic resonance imaging system and method for measuring the T1 of moving blood. The '042 method takes advantage of the relative motion between the instrument and the specimen to reduce the total measurement time. The entire sample is fully polarized to its equilibrium magnetization $M_0$. An inversion pulse nutates the spins so that they oppose the applied field. The spins start recovering from $-M_0$ to $+M_0$. The magnetization in a slice is imaged tp(i) seconds after the inversion where tp(1)<tp(2)<... tp(N). The slice is orthogonal to the direction of motion and all N images are taken at the same slice. The slice is selected by a pulse of magnetic field gradient in the direction of the motion. The spins in the slice are nutated by an RF pulse by 90 degrees to an orientation that is transverse to the applied static field. The precession of the spins in the transverse plane is recorded while an imaging sequence of gradient pulses is applied. Each image provides a point on the T1 recovery curve for every pixel where there is motion. The total measurement time is tp(N) plus the length of one imaging sequence. While the '042 method saves time over repolarizing and inverting after each measurement, the method is impractical in logging T1 of an earth formation or in measuring the T1 of a fluid flowing in a pipe. It would require the specimen to be in the uniform magnetic field for 5*T1+tp(N) seconds and would require the length of a magnet to be at least V*(5*T1+tp(N)) where V is the speed of relative motion between the apparatus and the specimen. Further, the '042 method would require the magnetic field to be uniform in the intersection of the specimen and the region of sensitivity of the RF coil or antenna, which is impossible with an "inside-out" NMR device used in well logging.

Thus, there is a continuing need to address one or more of the problems that are stated above.

SUMMARY

In one embodiment of the invention, a magnetic resonance measurement apparatus that is subject to relative motion between the apparatus and a specimen along a path includes a magnet, antennae and a circuit. The magnet polarizes the specimen, and the antennae are spatially distributed along the path. The circuit uses the antennae to perform magnetic resonance measurements and use the spatial distribution of the antennae to establish correlation between the different measurements.

Advantages and other features of the invention will become apparent from the following description, drawing and claims.

BRIEF DESCRIPTION OF THE DRAWING

FIGS. 9, 11, 12, 14 and 15 are schematic diagrams illustrating an NMR measurement tool according to different embodiments of the invention.

FIG. 10 is a cross-sectional view taken along line 10—10 of FIG. 11.

DETAILED DESCRIPTION

Figure 1:
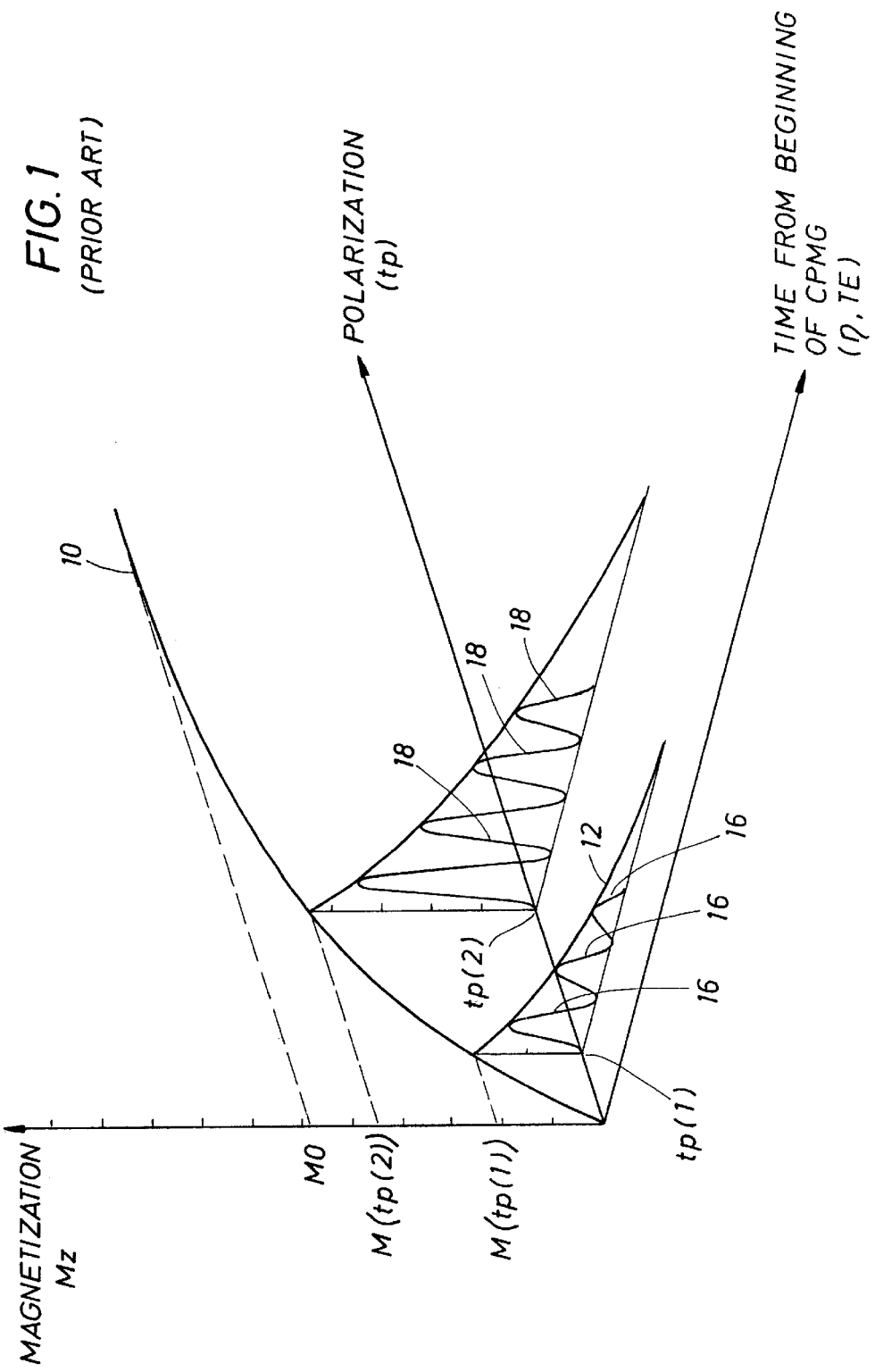
FIG. 1 is a diagram illustrating T1-based and T2-based measurements of the prior art.
Figure 2:
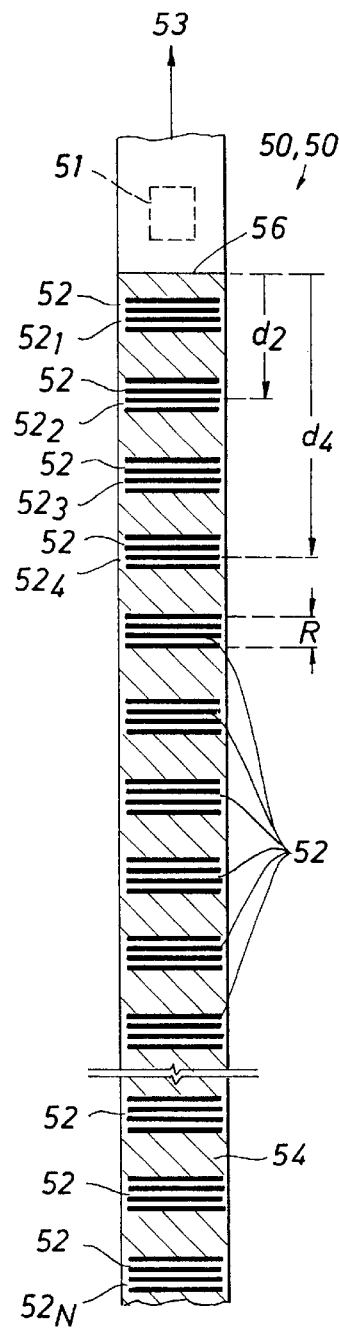
FIGS. 2, 3 and 4 are schematic diagrams of NMR measurement tools according to different embodiments of the invention.

Referring to FIG. 2, an embodiment 50 of a downhole magnetic resonance measurement tool (a nuclear magnetic resonance (NMR) measurement tool, for example) in accordance with invention includes antennae 52 (antennae $52_1$, $52_2$... $52_N$, as examples) that are spatially distributed along a longitudinal axis 53 of a magnet 54 (a permanent magnet, for example) of the tool 50. As described further below, during an acquisition sequence, each antenna 52 performs a magnetic resonance measurement, i.e., each antenna 52 receives spin echo signals from its surrounding formation. In this manner, because of the spatial distribution of the antennae 52 along the axis 53, the magnetic resonance measurement that is performed with each antenna 52 has a different polarization time when the tool 50 moves in a direction along the axis 53. Therefore, circuitry 51 (receiver circuitry, a radio frequency (RF) pulse generator, etc.) of the tool 50 may take advantage of the different magnetic resonance measurements to monitor the polarization growth profile and hence determine T1.

More particularly, each antenna 52 is located a different distance (distances $d_1$, $d_2$... $d_N$, as examples) from a top end 56 of the magnet 54. Therefore, for an approximately constant upward velocity, the polarization time that is experienced by a particular antenna 52 is approximately proportional to the distance of the antenna 52 from the top end 56 of the magnet 54. Each antenna may be tuned to a different frequency such that the volumes sensitive to the transmitted RF pulses are located at different radial distances into the formation. Prudent selection of the antenna frequencies ensures that pulse sequences applied to each antenna have a minimal effect on the magnetization of regions which will subsequently be investigated by other antennae. At the same time, radial locations of the sensitive regions may be sufficiently close that variations in fluid distributions between the regions are negligible.

For example, the top antenna $52_1$ may be located a distance $d_1$ from the top end 56 of the magnet 54 and thus, may be used to conduct a measurement using a polarization time that is proportional to the $d_1$ distance. The bottom antenna $52_N$ (being a distance $d_N$ from the top end 56 of the magnet 54) may be used to perform a measurement using a polarization time that is proportional to the $d_N$ distance.

Thus, the advantages of the above-described arrangement may include one or more of the following. Several T2-based measurements using different polarization times may be performed in a minimal amount of time. Analysis of the measurements made by each antenna at a particular point in the formation yields estimates for the T1 and T2 distributions of the fluids residing in this piece of formation, and these distributions may be correlated to aid in fluid identification. Comparison of the signals recorded by each antenna may also be used to derive estimates of the depth and/or velocity of the tool.

At a constant logging speed (called V), the effective average polarization time (called $t_p(i)$) that is experienced by a piece of formation that surrounds an antenna 52i (where "i" is between 1 and N) is approximately:

$$t_p(i) = \frac{d_i + R_i/2}{V}, \quad \text{Equation 4}$$

where $d_i$ is the distance from the top of antenna 52i to the top end 56 of the magnet 54, and $R_i$ is the vertical length of the antenna 52i. Thus, for a tool with N antennae 52 operating independently, N measurements corresponding to N different polarization times may be made with a single magnetic resonance acquisition sequence (a CPMG pulse train, for example) or a series of acquisition sequences applied successively to the individual antennae in rapid succession. It is noted that the measurements may indicate the magnetization levels of different formations. However, depth corrections may be used to map the measurements to the appropriate formations, as described below.

For purposes of accurately characterizing the polarization growth profile, the effective polarization times that are introduced by the antennae 52 may need to be properly defined. The method and apparatus for performing magnetic resonance measurements determines the longitudinal relaxation time, $T_1$, of earth formations surrounding a borehole. The apparatus comprises a logging device moveable through the borehole. The device comprises a magnet for producing a static magnetic field in the formations; at least two antennae spatially distributed along a longitudinal axis of the device; at least one transmitter for producing an oscillating magnetic field that is substantially orthogonal to the static magnetic field in the formations; and, a circuit that generates an acquisition sequence. During the sequence, each antenna performs nuclear magnetic resonance measurements. The circuit comprises a pulse generator coupled to the transmitter for applying RF pulses to the formations. The acquisition sequence further comprises a RF pulse sequence wherein for each antenna, the polarization time is approximately proportional to the distance from the antenna to one end of the magnet. A longitudinal magnetization, M, of the formations is determined as a function of the polarization time.

Figure 5:
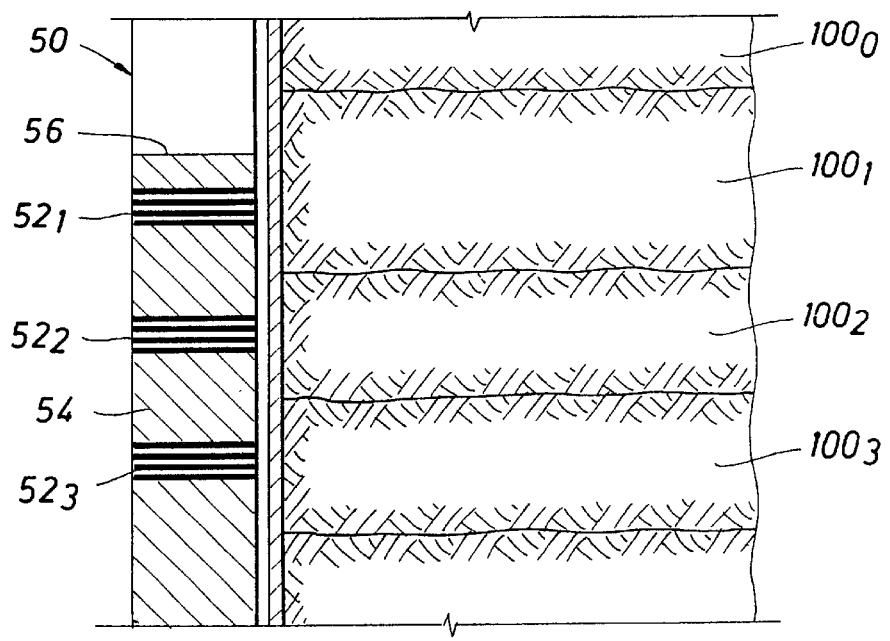
FIGS. 5 and 6 are schematic diagrams illustrating different measurement scenarios for different tool depths.
Figure 6:
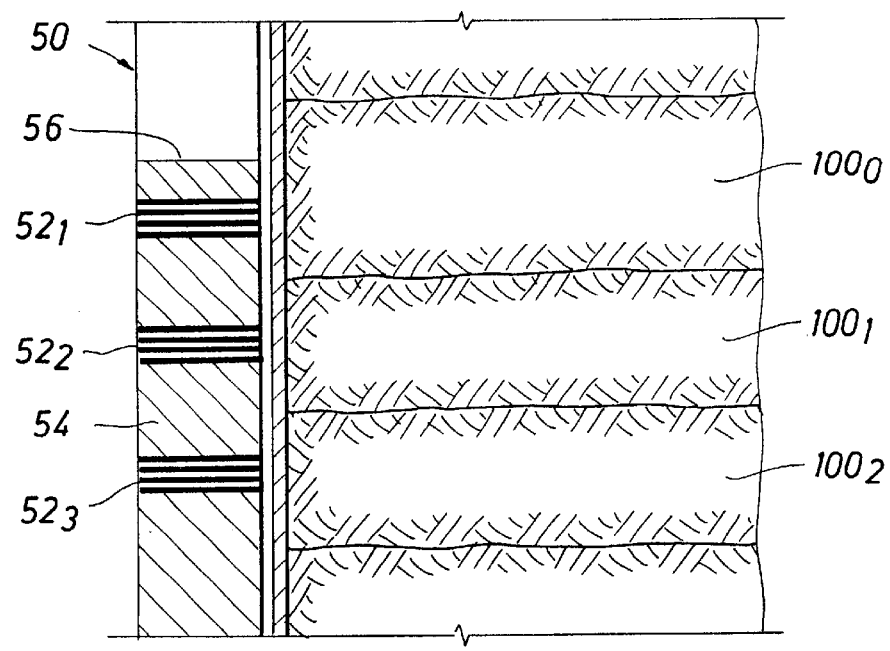
Figure 7:
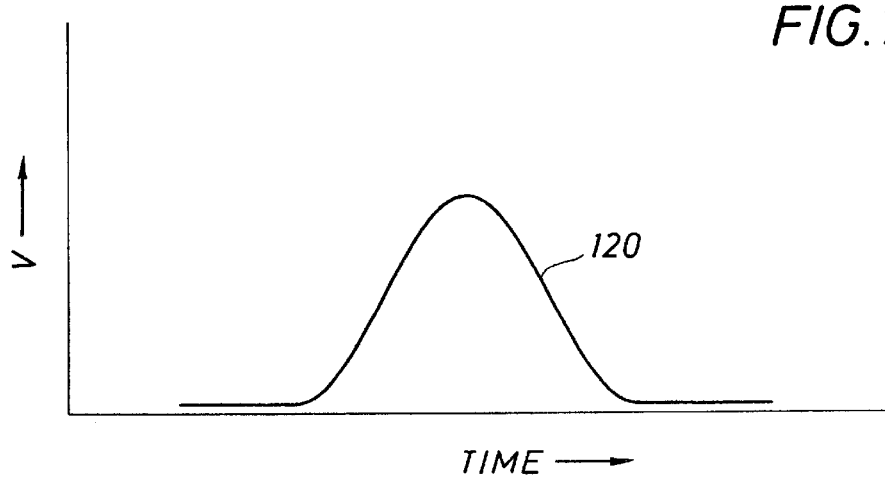
FIG. 7 is a waveform of an exemplary spin echo signal.

For example referring to FIG. 5, at a particular time, the antennae $52_1$, $52_2$ and $53_3$ may be used to conduct measurements in formations $100_1$, $100_2$ and $100_3$, respectively. In this manner, during the measurements, the antenna $52_2$, may receive a spin echo signal 120 (see FIG. 7) from the formation $100_2$, and the signal 120 may have a recognizable signature (a large amplitude, for example). After the tool 50 travels in an upward direction by a particular distance, the antennae $52_1$, $52_2$ and $53_3$ are aligned with the formations $100_0$, $100_1$, and $100_2$, respectively, as depicted in FIG. 6. In this manner, at this point, the antenna $52_3$ measures an echo signal that indicates the signature 120. Thus, from this information, a velocity of the tool 52 (calculated with the time to move between the formations described above) and a relative depth of the tool 50 may be determined.

Figure 8:
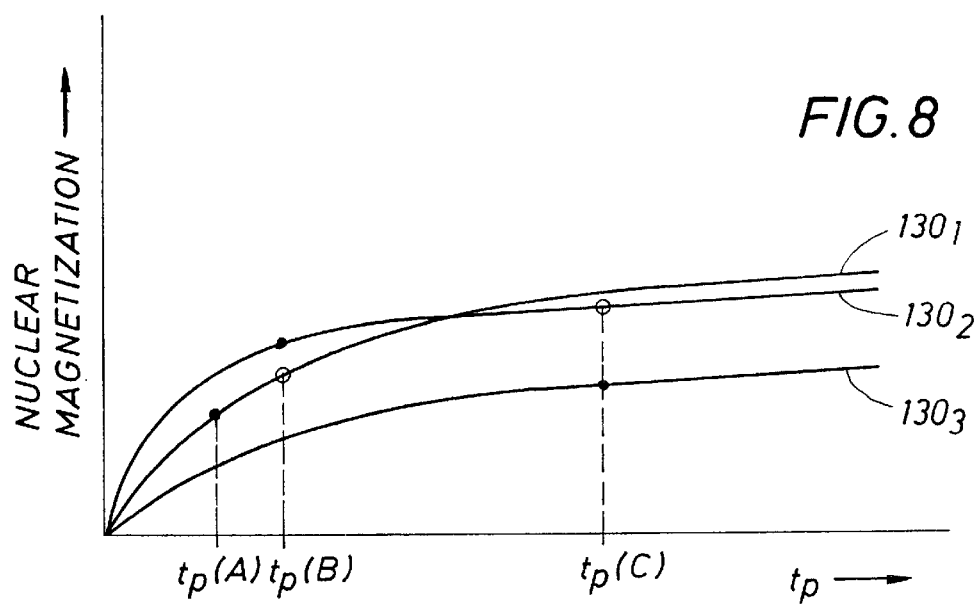
FIG. 8 are waveforms illustrating magnetization curves that are associated with different formations.
Figure 12:
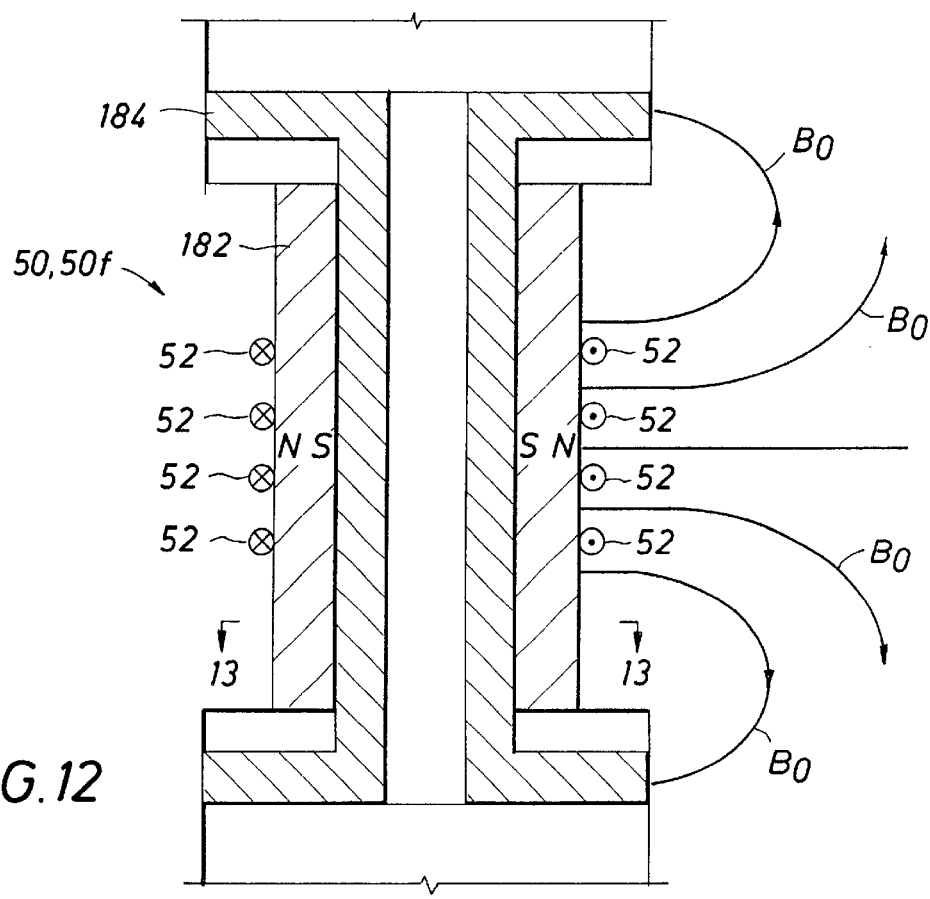

The above-described information may also be used to map measured magnetization values to the appropriate magnetization curve, as each magnetization curve is associated with a different formation. For example, referring to the scenario that is depicted in FIG. 5 and referring to FIG. 8, the antenna $52_2$ measures a point (indicated by the solid point) of a magnetization curve $130_2$, (that is associated with a formation $100_2$) for a polarization time $t_p(B)$. Similarly, for this orientation, the antennae $52_1$ and $52_3$ measure for polarization times $t_p(A)$ and $t_p(C)$, respectively, points (represented by solid points) of magnetization curves $130_1$, and $130_3$ espectively, that are associated with formations $100_1$ and $100_3$, respectively. However, when the tool 50 travels in an upward direction to create the scenario that is depicted in FIG. 6, antenna $52_1$ moves to fresh formation ($100_0$) whilst $52_2$ and $52_3$ move into formations $100_1$ and $100_2$, where they perform measurements which provide points on the polarization curves $130_1$ and $130_2$ with effective polarization times $t_p(B)$ and $t_p(C)$ respectively. Therefore, by determining the formation that surrounds a particular antenna 52, the tool 50 maps a measured magnetization value with the appropriate magnetization curve.

Assuming a constant velocity V and a cycle time $t_c$ between measurements on a particular antenna $52_i$, the tool 50 moves forward by a distance V $t_c$. The formation that surrounds the antenna $52_i$ at this instant is subdivided into two regions with different polarization. The upper region, of length, V $t_0$, has an associated polarization time $t_p$ dictated by the location of the antenna $52_i$ relative to the top of the magnet. This polarization time $t_p$ will be approximately equal to $\min(R_i, d_i/V)$. The lower region of the formation, of length $\max(0, R_i - V\, t_c)$, sensed the previous pulse sequence, immediately after which the longitudinal magnetization was zero. Therefore, this region of the formation has experienced a polarization time $t_p$ equal to the cycle time $t_c$.

In some embodiments, for purposes of conducting a saturation recovery measurement for each antenna 52, a standard CPMG acquisition sequence may be applied to destroy the magnetization. The sequence of events for K different short cycle times (each called $t_c(i)$) may be described by the following:

$$t_c \text{ (long)}-\text{CPMG(long)}-[t_c(i)-\text{CPMG}(i)-\text{Spoiling}]_{i=1,2,\ldots,K},$$

where "Spoiling" denotes one of many pulse sequences that destroys magnetization further. For increasing cycle times (called $t_c(i)$) the number of echoes in the monitoring CPMG sequence (called CPMG(i)) also increases, such that the transverse relaxation of longer T2 components may be adequately characterized.

Figure 16:
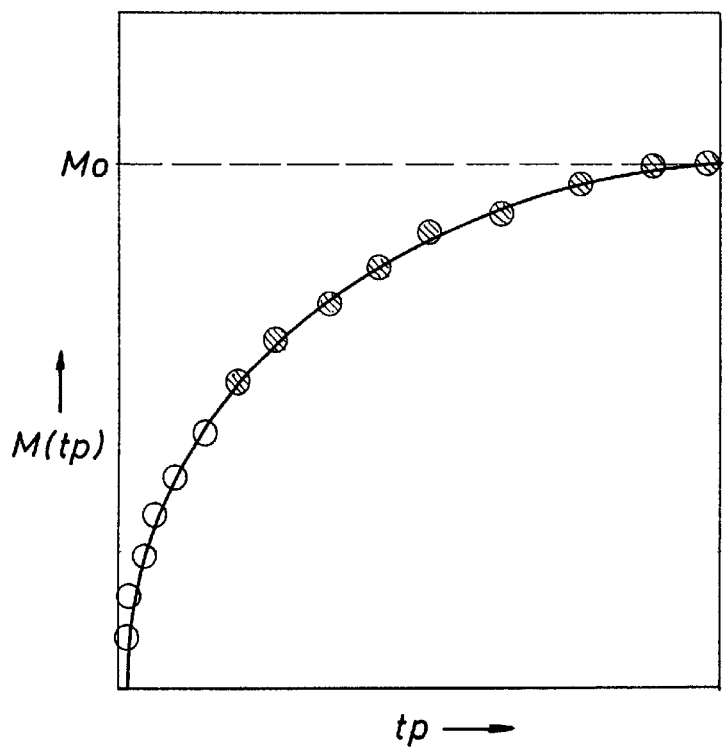
FIG. 16 illustrates a derived magnetization curve obtained through both T1-based and T2-based measurements.
Figure 17:
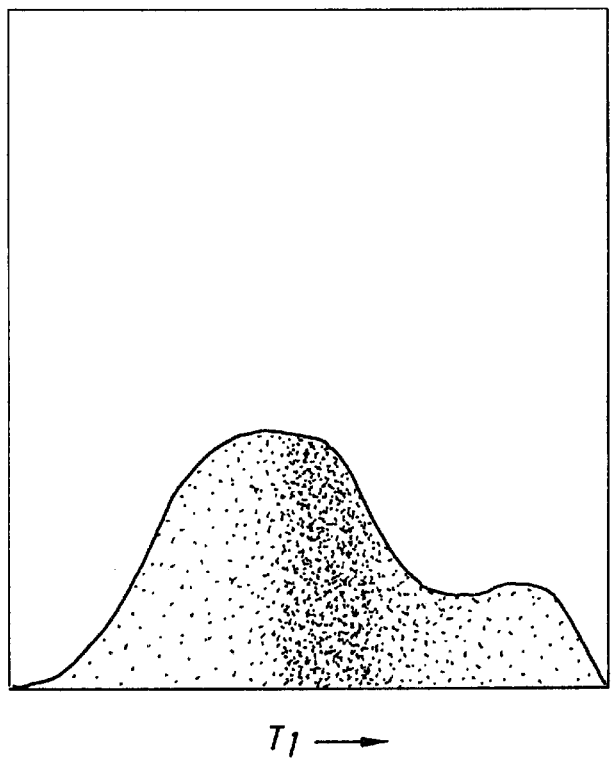
FIG. 17 illustrates a T1 amplitude distribution.

The above-described prepolarization and saturation-recovery techniques are complementary. Measurement sequences may be envisaged that combine the two types of measurements to cover a broad range of effective polarization times. The saturation-recovery technique is suitable for short polarization time measurements but becomes increasingly inefficient for long polarization times, due to the effects of tool motion. In contrast, for realistic logging speeds and antenna dimensions, short polarization times are not accessible using the prepolarization technique. However, as noted above, longer polarization time measurements are best obtained using prepolarization. The results of the two types of measurements may be combined to yield a full polarization growth profile, as depicted in FIG. 16.

Unlike conventional tools that rely on full polarization prior to measurement of echo decay profiles, the tool based on the prepolarization and saturation recovery methods, exploits the tool motion to define a set of effective polarization times. The restrictions on logging speed for the tool may be different from those of conventional single antenna tools. It is instructive to evaluate in more detail the optimum operating parameters for the tool. The simplest case to consider is the tool 50a of FIG. 2 that has the following exemplary specifications:

magnet length: L
number of antennae: $N_A$
antenna length: R
number of echoes in CPMG train: $N_E$
echo spacing: $T_E$
frequency switching time: $t_f$ Assuming an operating mode in which the antennae 52 conduct measurements sequentially, the time required for one complete measurement cycle (called $T_m$) is $$T_m = N_a(N_E T_E + t_f) \qquad \text{Equation 5}$$

During this time the tool moves forward by a distance (called D):

$$D = V T_m = V N_a(N_E T_E + t_f) \qquad \text{Equation 6}$$

In order that consecutive measurements for each antenna 52 do not overlap, the tool 50a moves through a distance equal to the length of the antenna, R, or greater, during the cycle time $T_m$. The highest vertical resolution of the tool 50a, defined by the shortest allowed sampling interval, is therefore equal to R. Setting D=R leads to an expression for the logging speed, in terms of the tool dimensions, that is described as follows:

$$V = \frac{R}{N_a(N_E T_E + t_f)}. \qquad \text{Equation 7}$$

For example, a tool defined by the specifications:
$N_a = 6$
R=0.20 m
$N_E = 500$
$T_E = 200$ us
$t_f = 20$ ms
gives an optimum logging speed of V=1000 m/hr (=3281 ft/hr) for a sample distance of 20 cm.

The above-described simple example is based only on the use of prepolarization for the determination of the polarization growth profile. More elaborate schemes that implement both prepolarization and saturation-recovery may also be conceived with comparable resolution and logging speeds. Although the fast T2 logging method does not provide accurate information concerning long T2 components, because of the small number of echoes recorded, short T2 components are resolved. These, together with the T1 information and the total-porosity, which are provided by the measurement, may be used to identify different types of fluid. In particular, bound water and free fluid volumes may be estimated using this measurement technique.

The tool 50 measures CPMG echo amplitude decay profiles as a function of the effective polarization time $t_p(r)$, at each position, r, along the longitudinal axes of the antennae, determined either by prepolarization or the saturation-recovery sequence method. Prior to analysis, the data is corrected for tool motion. This ensures that the effective polarization times, $t_p(r)$, are precisely determined and the measurements for each antenna are accurately referenced to depth. Interpolation on both the polarization time axis and the depth axis yields a two-dimensional data set describing the echo amplitude decay as a function of the polarization time. The amplitude of the jth echo measured for a polarization time $t_p(r)$ is $$A(r, j) = (1/R) \int dr \sum_k a_k F(r, j, R, V, t_p) \left(1 - e^{-\frac{t_p(r)}{T_{1\cdot k}}}\right) e^{-\frac{jT_E}{T_{2\cdot k}}}, \quad \text{Equation 8}$$

where $F(r,j,R,V,t_p)$ is a correction term that accounts for tool motion during the acquisition sequence and depends on the logging speed V and the antenna length R. Equation 8 assumes a uniform static magnetic field. Inversion of the two-dimensional data set yields a porosity, $$\phi = \sum_k a_k$$

Figure 18:
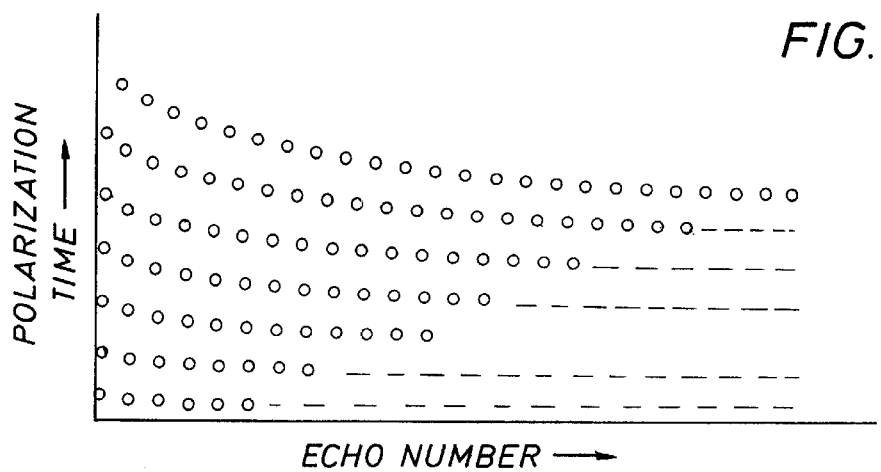
FIG. 18 is an illustration of measured spin echo signals for measurements conducted with different polarization times.
Figure 19:
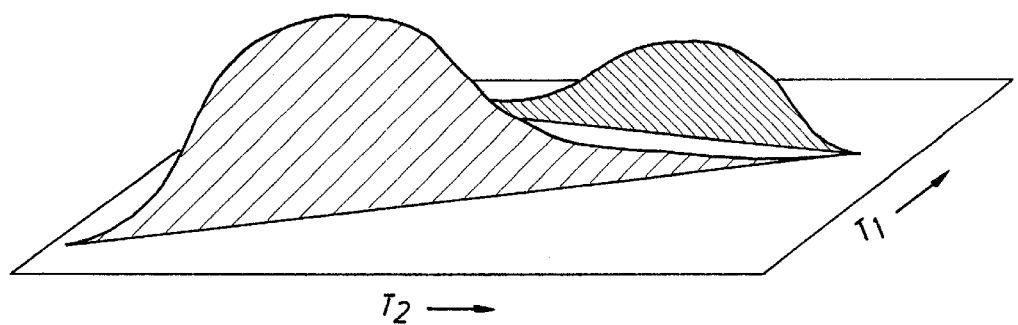
FIG. 19 illustrates a T1–T2 distribution map.

(that requires no polarization correction) and a T1–T2 distribution map that is depicted in FIG. 19. The inversion is depicted in FIGS. 18 and 19.

Figure 21:
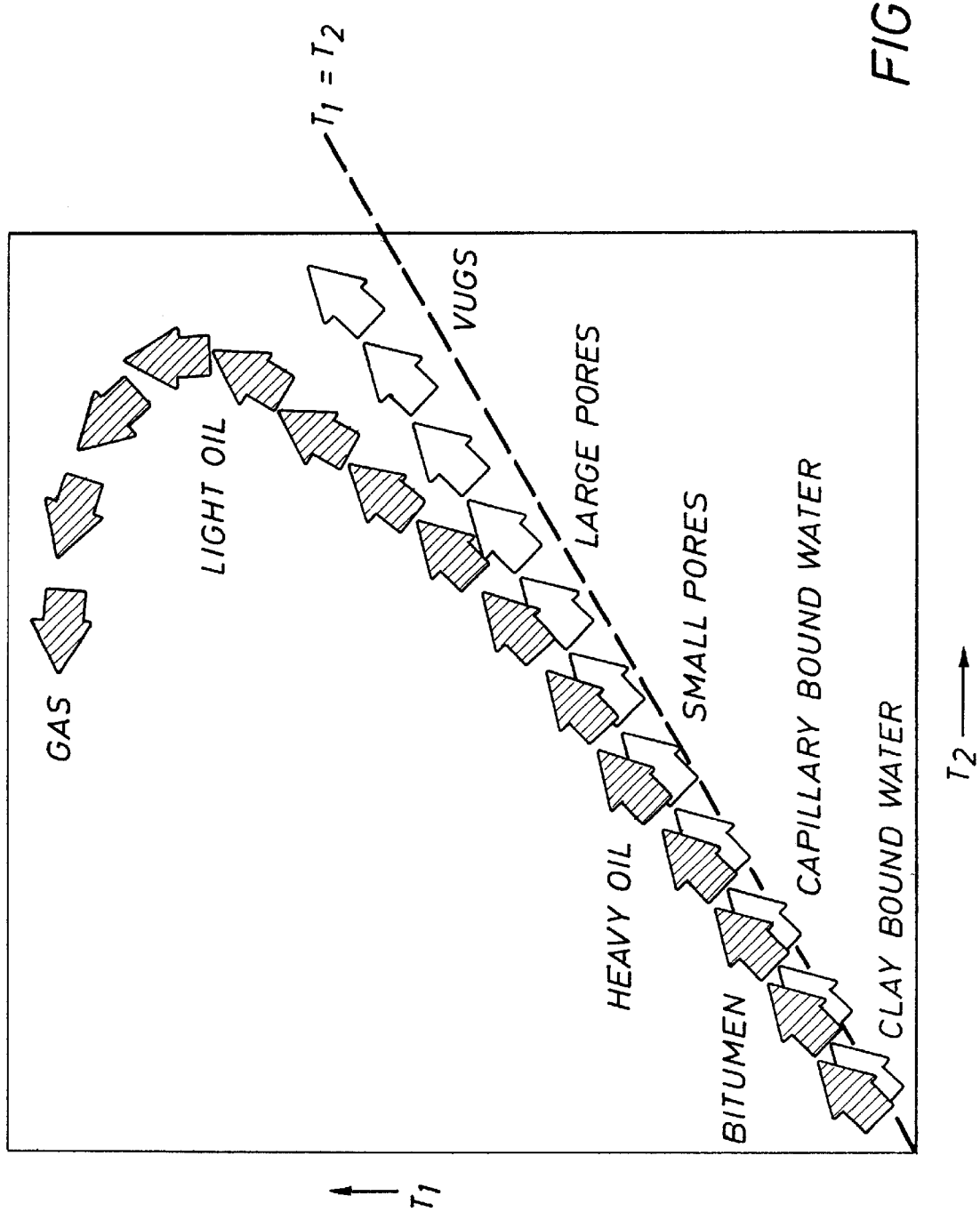
FIG. 21 is an illustration of the variation of $T_1$, with $T_2$ for water and hydrocarbons.

Referring to FIG. 21, comparison of both T1 and T2 times may be very useful for the identification of fluid types. Short T1 and T2 values indicate either clay bound water or heavy oils. The corresponding T1/T2 ratios are close to 1. For water components, the T1/T2 ratio varies relatively little with increasing relaxation times, its value generally falling between 1.0 and 1.5. This reflects the fact that water protons relax either via the surface relaxation mechanism or through bulk relaxation. Both processes contribute approximately equally to transverse and longitudinal relaxation. Light hydrocarbons and gas, on the other hand, may be significantly affected by diffusion, leading to substantially reduced T2 values, while T1 values remain high. The usefulness of the T1/T2 ratio measurement is depicted in FIG. 21, a figure that illustrates the variation of this ratio with T2 for different fluids.

Figure 3:
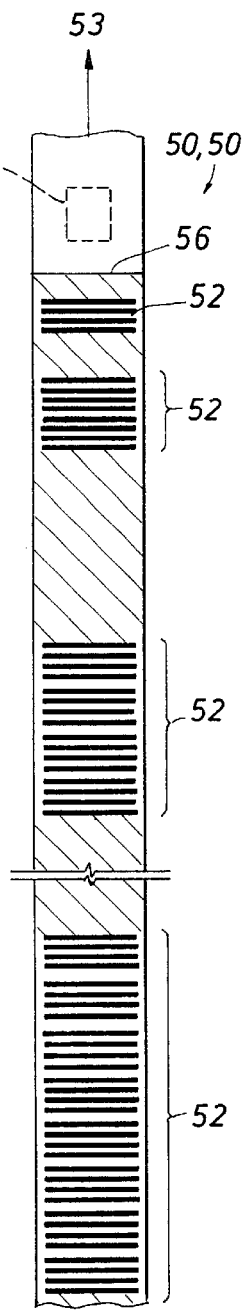

The selection of a specific tool design is governed by the type of measurement required and the desired logging speeds and resolution. For the purposes of fast T1 logging, the embodiment described above may be appropriate. Alternatively, in some embodiments, both T1 and T2 times may be measured rapidly. In these embodiments, a tool 50*b* (see FIG. 3) includes antennae 52 that are positioned such that the corresponding prepolarization lengths $d_i$ (measured from approximately the antenna 52 to top end 56 of the magnet 54) increase approximately logarithmically. This arrangement of the antennae 52 provides a set of polarization times that may better define the magnetization recovery. In effect, more measurements are made at shorter recovery times where the polarization changes most rapidly. The antenna lengths ($R_i$) themselves also increase with increasing prepolarization times. Long antennae 52 that experience long prepolarization times provide measurements of the full T2 distribution of a fully polarized formation using a longer CPMG acquisition time. Shorter antennae 52 provide better definition of the short polarization times. Shorter acquisition times need to be used for these antennae 52 since measurements are made only on quickly relaxing components. This, together with the short antenna length, allow more repeat measurements to be made so that signal/noise may be optimized.

Figure 4:
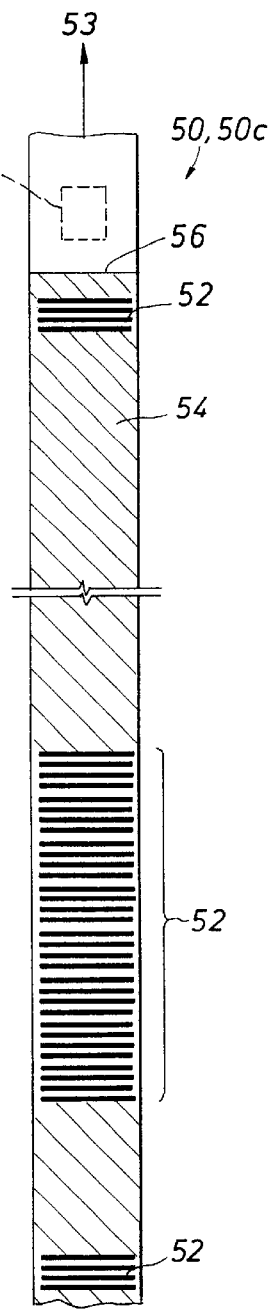

In some embodiments, a tool 50*c* (see FIG. 4) may be used. As shown in FIG. 4, two short antennae, located towards the top and bottom of the magnet provide high resolution measurements with corresponding short and long polarization times whilst a longer antenna located between these may be used to identify more completely the T2 distributions for a range of effective polarization times using saturation-recovery type sequences.

Thus, the spacing between the antennae 52, depending on the particular embodiment, may be uniform or may vary. Furthermore, the size of the antennae 52 on a particular tool may be uniform in some embodiments, and in other embodiments, the size of the antennae 52 on a particular tool 50 may vary. Therefore, many other embodiments are possible than the embodiments described herein.

Different additional exemplary embodiments 50*d*, 50*e*, 50*f*, 50*g* and 50*h* of the tool 50 are depicted in FIGS. 9–15. In particular, referring to FIG. 9, the tool 50*d* is a wireline tool that may include antennae 52 (one or more being each) that are spatially located along a longitudinal axis 151 of the tool 50*d* and circumscribe a solid cylindrical magnet 154. As an example, a receiver 152 may be coupled to each antenna 52, and the permanent magnet 154 may be polarized with the magnetic poles being located on opposite sides of the tool 50*d*. Transmitter electronics 158 is connected to a transmitter antenna 156. In some embodiments, all of the receivers 152 operate at the same transmitted frequency. The transmitter antenna 156 is pulsed, for example, when the tool 50*d* moves by the smallest axial spacing between adjacent antennae 52. Each consecutive pulse sequence has a slightly different frequency so that the sensed region does not overlap with the region where the previous pulse sequence destroyed the nuclear magnetization. For these embodiments, the antennae 42 have negligible coupling (mutual inductance). This may be ensured by, for example, sufficiently spacing the antennae 52 or by using compensation (bucking) antennae, as depicted in FIG. 20 and described below.

Figure 20:
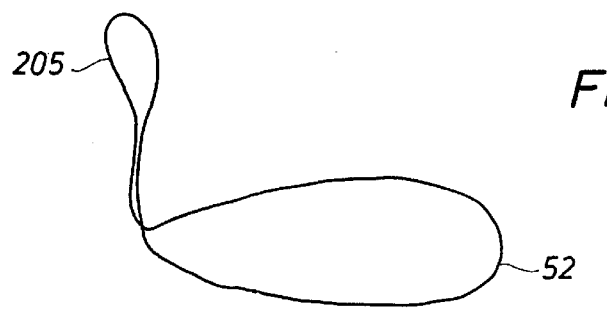
FIG. 20 is an illustration of an antenna with a feature to minimize flux coupling with other antennae.

In this manner, referring to FIG. 20, for purposes of minimizing mutual coupling between the antennae 52, each antenna 52 may be associated with a smaller (for example) associated coupling reduction antenna 205 that may be formed from wire(s) that form the antenna 52. In this manner, the wire(s) may be looped in an orientation that produces a magnetic flux to substantially cancel flux that is produced by the antenna 52. As shown, in some embodiments, the magnetic moment of a particular antenna 205 may be substantially orthogonal to the magnetic moment of its associated antenna 52.

The tool 50*e* (see FIG. 11) is a logging while drilling (LWD) tool that is similar to the wireline tool 50*d* except that the LWD tool 50*e* includes an inner protective sleeve 175 (see also FIG. 10) that extends through the magnet 154 and forms a longitudinal passageway 171. A drill collar 177 may surround the magnet 154.

Figure 13:
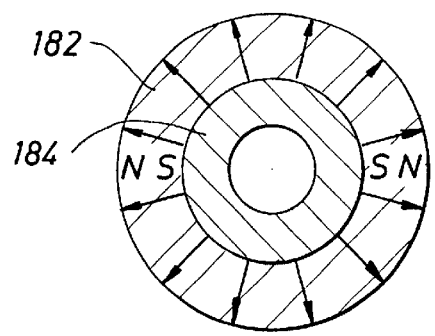
FIG. 13 is a cross-sectional view taken along line 13—13 of FIG. 12.

The tool 50*f* may include a permanent magnet 182 that is radially polarized as depicted in FIG. 13. The antennae 52 circumscribe the magnet 182 and are radially spaced along the longitudinal axis of tool 50*f*. The magnet 182, in turn, circumscribes a soft iron yoke 184. In some embodiments, the tool 50*f* includes a single transmitter coil (not shown), and the antennae 52 form multiple receiving coils. In these embodiments, the antennae 52 may be tuned to the same frequency, and the transmitter coil may sequentially radiate pulse sequences that have different frequencies. Depending on the particular embodiment, the sequential radiation of the pulses may be pursuant to predefined direction along the tool (the antennae 52 may be energized one after the other in a downward direction, for example) or may vary between upper and lower antennae 52, for example.

In some embodiments, the antennae 52 may each form a transmission/reception coil and each coil may be tuned to a slightly different frequency. In this manner, the antennae 52 may each be energized one at a time in a predefined sequence. The antennae 52 that are not energized are disconnected (open circuited) from the energized antenna 52 for purposes of minimizing coupling between the antennae 52.

Figure 14:
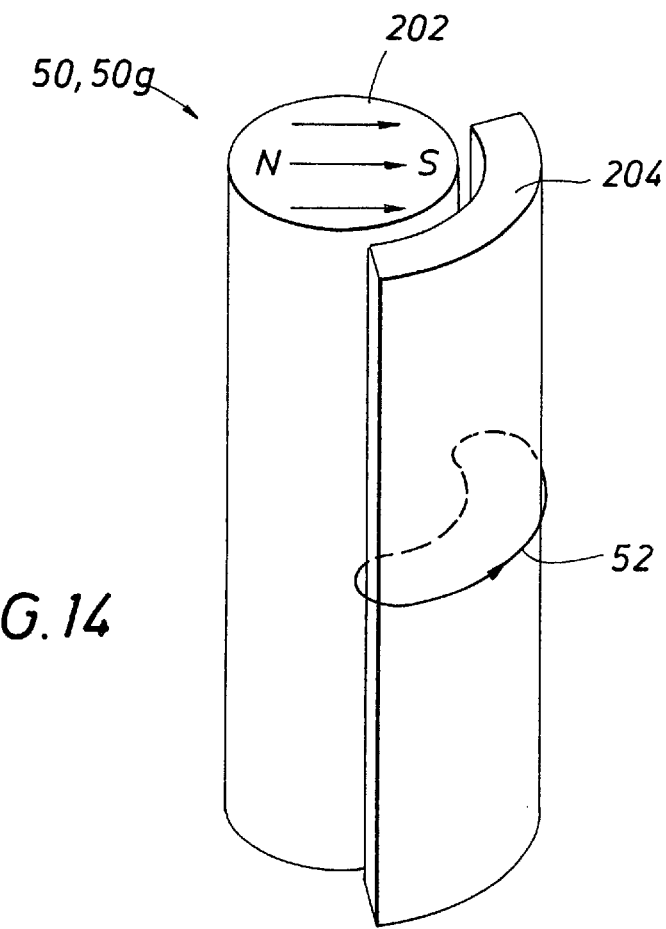
Figure 15:
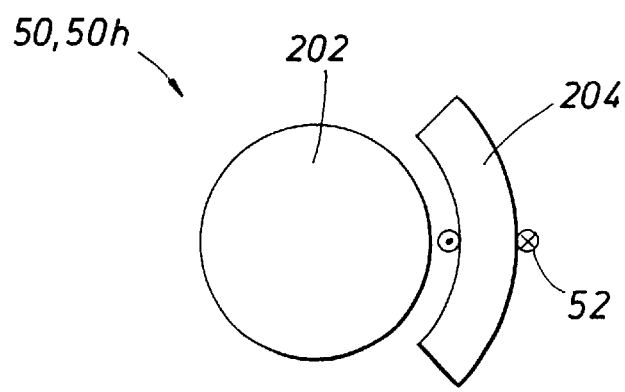

Referring to FIG. 14, the tool 50g may include a solid cylindrical magnet 202, similar to the magnet 154 (see FIG. 9) of the tool 50d. A ferrite material 204 may extend along the longitudinal axis of the tool 50g and partially circumscribe the magnet 202. The antennae 52 (one shown in FIG. 14) may circumscribe the ferrite material 204 so that magnetic moment of the antennae are parallel to the longitudinal axis of the tool 50g. Alternatively, a tool 50h (see FIG. 15) may be similar in design to the tool 50g except that the moments of the antennae 52 are orthogonal to the longitudinal axis.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An apparatus for determining the longitudinal relaxation time, $T_1$, of earth formations surrounding a borehole, comprising:
    a logging device moveable through the borehole, wherein the device comprises:
        a magnet for producing a static magnetic field in the formations;
        at least two antennae spatially distributed along a longitudinal axis of the device;
        at least one transmitter for producing an oscillating magnetic field that is substantially orthogonal to the static magnetic field in the formations; and,
        a circuit that generates an acquisition sequence and during the sequence, each antenna performs nuclear magnetic resonance measurements, wherein the circuit comprises a pulse generator coupled to the transmitter for applying RF pulses to the formations and the acquisition sequence further comprises an RF pulse sequence including a polarization time, wherein for each antenna, the polarization time is approximately proportional to the distance from the antenna to one end of the magnet.

2. The apparatus of claim 1, wherein the antennae are logarithmically spaced along the longitudinal axis.

3. The apparatus of claim 1, wherein the antennae are uniformly spaced along the longitudinal axis.

4. The apparatus of claim 1, wherein the antennae are unevenly spaced along the longitudinal axis.

5. The apparatus of claim 1 wherein each antenna has a length and the lengths of some of the antennae are different.

6. The apparatus of claim 1 wherein each antenna has a length and the lengths of the antennae are approximately the same.

7. The apparatus of claim 1, wherein the magnet comprises a cylindrical magnet and the antennae circumscribe the magnet.

8. The apparatus of claim 7, wherein the apparatus comprises a wireline tool.

9. The apparatus of claim 8, further comprising a ferrite material extending along the longitudinal axis of the device and partially circumscribing the magnet.

10. The apparatus of claim 9, wherein the antennae circumscribe the ferrite material.

11. The apparatus of claim 10, wherein the antennae form magnetic moments that are parallel to the longitudinal axis of the device.

12. The apparatus of claim 10, wherein the antennae form magnetic moments that are orthogonal to the longitudinal axis of the device.

13. The apparatus of claim 7, further comprising at least two electromagnetic receivers wherein each receiver is coupled to an antenna to receive indications of spin echo signals.

14. The apparatus of claim 13, wherein the receivers are tuned to the same frequency and the transmitter radiates RF pulse sequences at that frequency.

15. The apparatus of claim 13, wherein the receivers are tuned to different frequencies and the transmitter radiates RF pulse sequences at the different frequencies.

16. The apparatus of claim 1 wherein each antennae comprises a primary antenna and a coupling reduction antenna to prevent substantial magnetic coupling between another one of the antennae and the primary antenna.

17. The apparatus of claim 16, wherein the coupling reduction antenna forms magnetic moments that are orthogonal to a magnetic moment of the primary antenna.

18. The apparatus of claim 1, wherein the magnet comprises a tubular magnet and the antennae circumscribe the magnet.

19. The apparatus of claim 18, wherein the apparatus comprises a logging-while-drilling tool.

20. The apparatus of claim 19, wherein the magnet is radially polarized.

21. The apparatus of claim 19, further comprising a yoke circumscribed by the magnet.

22. The apparatus of claim 21, wherein the antennae are tuned to the same frequency and the transmitter radiates RF pulse sequences at that frequency.

23. The apparatus of claim 21, wherein the antennae are tuned to different frequencies and the transmitter radiates RF pulse sequences at the different frequencies.

24. The apparatus of claim 1, wherein at least two of the antennae are adapted to receive electromagnetic fields.

25. The apparatus of claim 1, wherein the antennae are adapted to both transmit and receive electromagnetic fields.

26. A method for determining the longitudinal relaxation time, $T_1$, of earth formations surrounding a borehole, comprising the steps of:
    while moving a logging device through the borehole:
        producing a static magnetic field in the formations with a magnet;
        spatially distributing at least two antennae along a longitudinal axis of the logging device;
        producing an oscillating magnetic field that is substantially orthogonal to the static magnetic field in the formations; and
        generating an acquisition sequence such that during the sequence, each antenna performs nuclear magnetic resonance measurements, wherein the generating step further comprises the steps of applying an RF pulse sequence to the formation and, for each antenna, establishing a polarization time that is approximately proportional to the distance from the antenna to one end of the magnet; and,
        determining a longitudinal magnetization, M, of the formations as a function of the polarization time.

27. The method of claim 26, wherein the step of determining the longitudinal magnetization further comprises the step of magnetically prepolarizing the formations.

28. The method of claim 27, wherein the step of determining the longitudinal magnetization further comprises the step of performing a saturation recovery measurement with each antenna and combining the magnetizations determined using prepolarization and saturation recovery in order to determine $T_1$.

29. The method of claim 26, wherein the spatially distributing step further comprises the step of uniformly spacing the antennae along the longitudinal axis.

30. The method of claim 26, wherein the spatially distributing step further comprises the step of spacing the antennae logarithmically along the longitudinal axis.

31. The method of claim 26, wherein the spatially distributing step further comprises the step of unevenly spacing the antennae along the longitudinal axis.

32. The method of claim 26, further comprising the step of sequentially conducting the magnetic resonance measurements with each antenna.

33. The method of claim 32 wherein the logging device moves through a distance at least equal to a length of the antenna so that those consecutive magnetic resonance measurements for each antenna do not overlap.

34. The method of claim 26, further comprising the step of determining a depth and/or velocity of the logging device.

35. The method of claim 26, further comprising the step of determining the transverse relaxation time, $T_2$, of earth formations surrounding a borehole.

36. The method of claim 35 further comprising the step of interpolating echo amplitude decay as a function of polarization time.

37. The method of claim 36 further comprising the step of correcting the echo amplitude decay for an effect of tool motion during the acquisition sequence.

38. The method of claim 35, further comprising the step of determining the porosity of the formations.

39. The method of claim 35, further comprising the step of determining a $T_1$–$T_2$ distribution map.

40. The method of claim 35, further comprising the step of identifying fluids in the formations.

* * * * *